(12) United States Patent
Kamei et al.

(10) Patent No.: US 6,868,008 B2
(45) Date of Patent: *Mar. 15, 2005

(54) NON-VOLATILE SEMICONDUCTOR MEMORY DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 41 days.

This patent is subject to a terminal disclaimer.

(21) Appl. No.: 10/385,506

(22) Filed: Mar. 12, 2003

(65) Prior Publication Data

US 2003/0198103 A1 Oct. 23, 2003

(30) Foreign Application Priority Data

Mar. 18, 2002 (JP) ......................................... 2002-074597

(51) Int. Cl.⁷ ............................................. G11C 16/06
(52) U.S. Cl. .............................. 365/185.09; 365/185.11; 365/185.2
(58) Field of Search ....................... 365/185.09, 185.11, 365/185.2

(56) References Cited

U.S. PATENT DOCUMENTS

| | | | |
|---|---|---|---|
| 5,408,115 A | | 4/1995 | Chang |
| 5,422,504 A | | 6/1995 | Chang et al. |
| 5,494,838 A | | 2/1996 | Chang et al. |
| 5,546,402 A | * | 8/1996 | Niijima et al. ......... 365/185.11 |
| 5,844,910 A | * | 12/1998 | Niijima et al. ......... 365/185.11 |
| 5,969,383 A | | 10/1999 | Chang et al. |
| 6,122,194 A | * | 9/2000 | Chung et al. .......... 365/185.09 |
| 6,177,318 B1 | | 1/2001 | Ogura et al. |
| 6,248,633 B1 | | 6/2001 | Ogura et al. |
| 6,255,166 B1 | | 7/2001 | Ogura et al. |
| 6,570,790 B1 | * | 5/2003 | Harari ................... 365/185.09 |
| 6,707,742 B2 | * | 3/2004 | Kamei et al. ............... 365/210 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. Appl. No. 09/955,158, filed Sep. 19, 2001, Kanai et al.
U.S. Appl. No. 09/955,160, filed Sep. 19, 2001, Kanai et al.
U.S. Appl. No. 10/115,913, filed, Apr. 5, 2002, Kamei.
U.S. Appl. No. 10/115,956, filed Apr. 5, 2002, Kamei.
U.S. Appl. No. 10/153,611, filed May 24, 2002, Owa.
U.S. Appl. No. 10/153,686, filed May 24, 2002, Owa.
U.S. Appl. No. 10/153,736, filed May 24, 2002, Owa.
U.S. Appl. No. 10/157,896, filed May 31, 2002 Kamei et al.
U.S. Appl. No. 10,157,897, filed May 31, 2002, Kamei et al.
U.S. Appl. No. 10/193,066, filed Jul. 12, 2002, Kanai.
U.S. Appl. No. 10/193,602, filed Jul. 12, 2002, Kanai.
U.S. Appl. No. 10/197,643, filed Jul. 18, 2002, Kanai et al.
U.S. Appl. No. 10/197,644, filed Jul. 18, 2002, Kamei.
U.S. Appl. No. 10/197,645, filed Jul. 18, 2002, Natori.
U.S. Appl. NO. 10/197,646, filed Jul. 18, 2002, Kanai.
U.S. Appl. No. 10/197,668, filed Jul. 18, 2002, Kanai.

(List continued on next page.)

Primary Examiner—Huan Hoang
(74) Attorney, Agent, or Firm—Oliff & Berridge, PLC

(57) ABSTRACT

A non-volatile semiconductor device in which the number of redundant cells is not increased in proportion to the number of simultaneously accessed bits, having a redundant cell layout which prevents an increase in access time. This non-volatile semiconductor memory device has a regular cell array in which a plurality of memory cells are arranged. The regular cell array is divided into N sector regions in the row direction. Each of the N sector regions is divided into n first memory blocks in the row direction. One of the n first memory blocks is a redundant memory block. The (n−1) first memory blocks correspond to (n−1) input/output terminals.

12 Claims, 12 Drawing Sheets

OTHER PUBLICATIONS

U.S. Appl. No. 10/229,064, filed Aug. 28, 2002, Kamei.
U.S. Appl. No. 10/246,486, filed Sep. 19, 2002, Natori.
U.S. Appl. No. 10/246,665, filed Sep. 19, 2002, Natori.
U.S. Appl. No. 10/246, 708, filed Sep. 19, 2002, Natori.
U.S. Appl. No. 10/246,727, filed Sep. 19, 2002, Natori.
U.S. Appl. No. 10/323,921, filed Dec. 20, 2002, Natori.
U.S. Appl. No. 10/385,661, filed Mar. 12, 2003, Kamei.
U.S. Appl. No. 10/373,166, filed Feb. 26, 2003, Kamei et al.
U.S. Appl. No. 10/356,644, filed Feb. 03, 2003, Kamei et al.
U.S. Appl. No. 10/377,699, filed Mar. 4, 2003, Kamei et al.
U.S. Appl. No. 10/377,707, filed Mar. 4, 2003, Kamei et al.
U.S. Appl. No. 10/361,573, filed Feb. 11, 2003, Kamei et al.

Yutaka Hayashi et al., "Twin MONOS Cell with Dual Control Gates," 2000, IEEE VLSI Technology Digest.

Kuo–Tung Chang et al., "A New SONOS Memory Using Source–Side Injection for Programming," IEEE Electron Device Letters, vol. 19, No. 7, Jul. 1998, pp 253–255.

Wei–Ming Cheng et al., "A Novel Flash Memory Device with S Plit Gate Source Side Injection and ONO Charge Storage Stack (SPIN)," 1997, VLSI Technology Digest, pp 63–64.

* cited by examiner

NON-VOLATILE SEMICONDUCTOR MEMORY DEVICE

Japanese Patent Application No. 2002-74597, filed on Mar. 18, 2002, is hereby incorporated by reference in its entirety.

BACKGROUND OF THE INVENTION

The present invention relates to a non-volatile semiconductor memory device in which redundant cells are provided in a regular cell array in which memory cells are disposed.

As an example of a non-volatile semiconductor memory device, a MONOS (Metal-Oxide-Nitride-Oxide-Semiconductor or -Substrate) non-volatile semiconductor memory device is known. In the MONOS non-volatile semiconductor memory device, a gate insulating layer between a channel and a gate is formed by stacking a silicon oxide film, a silicon nitride film, and a silicon oxide film, and charges are trapped in the silicon nitride film.

The MONOS non-volatile semiconductor memory device is disclosed by Y. Hayashi, et al, in 2000 Symposium on VLSI Technology Digest of Technical Papers, pp. 122–123. This literature discloses a MONOS flash memory cell including two non-volatile memory cells (MONOS memory cells) controlled by one word gate and two control gates. Specifically, one flash memory cell has two charge trap sites.

A regular cell array is formed by arranging a plurality of MONOS flash memory cells having such a structure in a row direction and a column direction.

Redundant cells are provided to the regular cell array. When a defective memory cell is found, the redundant cell is used in place of the defective cell.

Taking a memory device in which 16 bits of data are read at the same time as an example, 16 divided memory blocks are provided corresponding to 16 input/output terminals I/O0 to I/O15.

Conventionally, the redundant cells are provided to each of the 16 memory blocks. For example, one redundant memory cell column is provided for a plurality of regular memory cell columns in each memory block. When a defect occurs in one of the memory cells in one regular memory cell column, the redundant memory cell column is used in place of this regular memory cell column.

In such a conventional structure, the number of redundant memory cell columns is increased as the number of consimultaneously accessed bits is increased. This is because the redundant memory cell columns are disposed in each of the memory blocks provided corresponding to the number of simultaneously accessed bits.

Moreover, it is necessary to provide a switch for switching from the regular memory cell column including the defective cell to the redundant memory cell column on the side of the input stage of a sense amplifier. The presence of the switch causes a signal delay to occur, whereby the access time is increased.

BRIEF SUMMARY OF THE INVENTION

The present invention may provide a non-volatile semiconductor device enabling to improve the layout of redundant cells for minimizing an area occupied by the redundant cells in a chip even if the number of simultaneously accessed bits is increased.

The present invention may also provide a non-volatile semiconductor device preventing an increase in access time even if a defective cell can be switched to a redundant cell.

According to the present invention, there is provided a non-volatile semiconductor memory device comprising:

a regular cell array in which a plurality of memory cells are arranged in a column direction and a row direction, each of the memory cells having first and second non-volatile memory cells that are controlled by one word gate and first and second control gates, wherein:

the regular cell array is divided in the row direction into N sector regions;

each of the N sector regions is divided in the row direction into n first memory blocks; and one of the n first memory blocks is a redundant memory block including a plurality of redundant memory cells.

In this cell layout, it suffices that the number of redundant memory blocks be only one if the number of (n−1), which is the number of simultaneously accessed bits, is increased.

The non-volatile semiconductor memory device may further comprise: n sense amplifiers provided corresponding to the n first memory blocks; and a plurality of pass circuits each of which supplies a current which is output from corresponding one of the memory cells selected in each of the n first memory blocks to corresponding one of the n sense amplifiers. Specifically, an exclusive sense amplifier can be provided to the redundant memory block. This eliminates the need to provide a switch for switching from the memory block including a defective cell to the redundant memory block on the side of the input stage of the sense amplifier. Therefore, since a signal delay does not occur on the side of the input stage of the sense amplifier, the access time is not increased.

The non-volatile semiconductor memory device may further comprise: (n−1) data output terminals; and a multiplex circuit which selects (n−1) sense amplifier outputs from the n sense amplifiers, and then supplies the selected (n−1) sense amplifier outputs respectively to the (n−1) data output terminals.

This enables switching from the memory block including a defective cell to the redundant memory block to be performed on the side of the output stage of the sense amplifier. The switching on the side of the output stage does not increase the access time.

The non-volatile semiconductor memory device may further comprise: a reference cell region including at least one reference memory cell which supplies a reference current to the n sense amplifiers.

In the non-volatile semiconductor memory device, the reference cell region may be divided in the row direction into n second memory blocks; one of the n second memory blocks may be a redundant memory block; and the reference current may be respectively supplied from the n second memory blocks to the n sense amplifiers.

The number of the memory cells arranged in the row direction in the n first memory blocks may be equal to the number of the memory cells arranged in the row direction in the n second memory blocks. This reduces unevenness of characteristics (such as temperature characteristics, voltage characteristics, and the like) of cell currents depending on the position of the cells at least in the row direction, between the first and second blocks. This enables to reduce the difference in characteristics of cell currents (one is a reference cell current) from the cells which depends on the position of the cells, and are simultaneously selected in the first and second blocks, whereby the state of the memory can be judged precisely.

Each of the N sector regions may be divided in the column direction into M large blocks, each of the M large blocks being divided in the column direction into m small blocks; and the number of the memory cells arranged in the column direction in each of the n second memory blocks may be smaller than the number of the memory cells arranged in the column direction in each of the m small blocks.

The small block is a minimum unit when manufacturing memory cells in a regular cell. The number of cell columns in the second memory block in the reference cell region may be smaller than the number of cell columns of the minimum unit.

The select cells in the regular cell array and the reference cell region when reading data may be specified as follows. Lower order addresses in row and column addresses used in the cell selection in the regular cell array may be used in the cell selection in the reference cell region when data is read.

Each of the n first memory blocks may include four bit lines extending in the column direction; and the number of the memory cells arranged in the row direction in each of the n first memory blocks may be four. The four memory cells are a minimum unit for driving the memory so that an area occupied by the redundant memory block can be minimized.

Data can be erased in units of each of the N sector regions. In this case, a control gate driver section which drives the first and second control gates of each of the memory cells in the regular cell array may include N local control gate drivers provided corresponding to the N sector regions. Each of the N local control gate drivers may set potentials of the first and second control gates in corresponding one of the sector regions independent of other sector regions. When data is erased, one of the N local control gate drivers may be selected to supply an erase potential to the first and second control gates in corresponding one of the N sector regions. Thus data can be erased in units of each of the sector regions.

Note that each of the first and second non-volatile memory cells may have an ONO film formed of an oxide film (O), a nitride film (N), and an oxide film (O) as a charge trap site. However, the structure of the trap site is not limited thereto.

DETAILED DESCRIPTION OF THE EMBODIMENT

One embodiment of the present invention is described below with reference to the drawings.

Memory Cell

Figure 1:
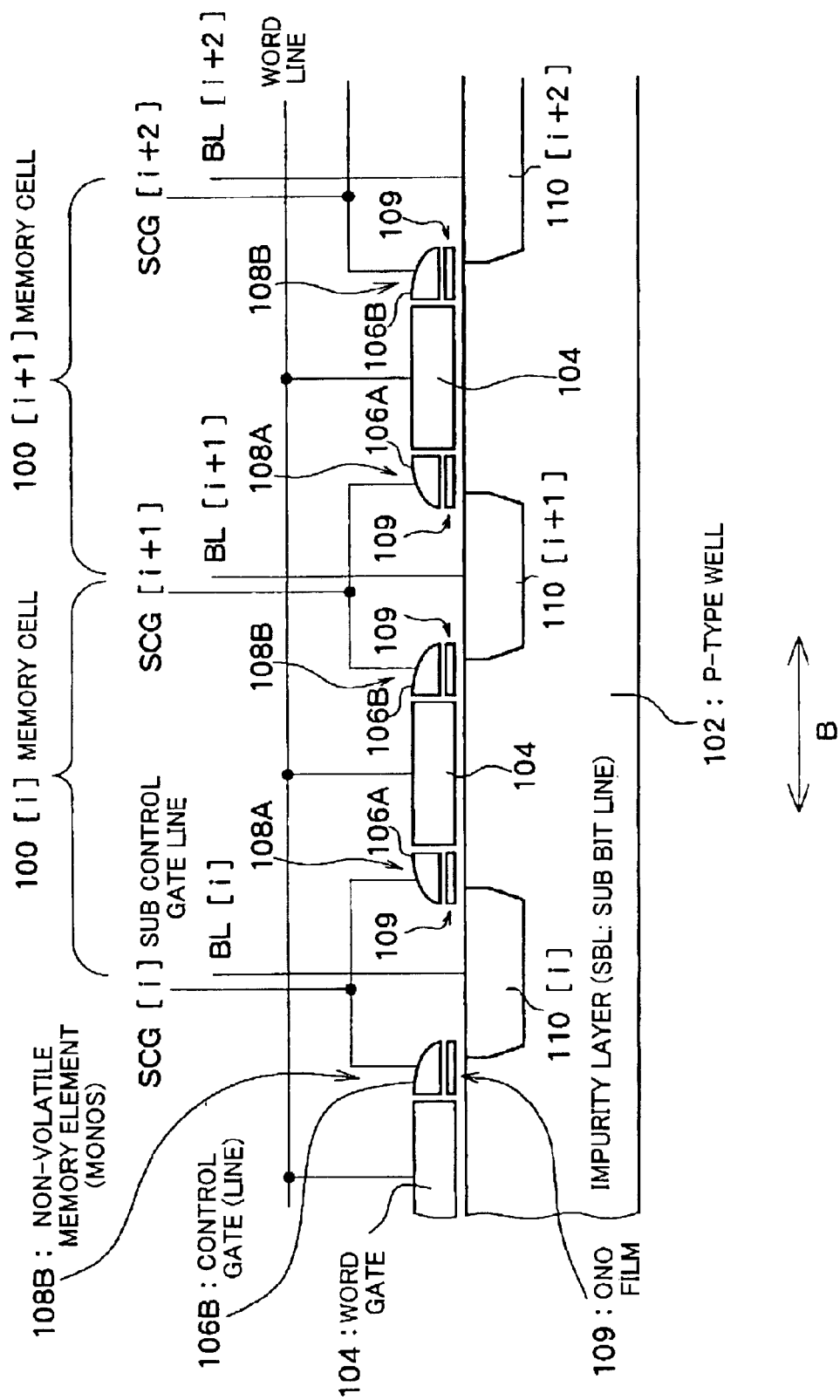
FIG. 1 is a cross-sectional view showing memory cells used in a non-volatile semiconductor memory device according to one embodiment of the present invention.

FIG. 1 shows a cross section of a non-volatile semiconductor memory device. In FIG. 1, one memory cell 100 includes a word gate 104 which is formed of a material containing polysilicon or the like on a P-type well 102 through a gate oxide film, first and second control gates 106A and 106B, and first and second memory cells (MONOS memory cells) 108A and 108B.

The first and second control gates 106A and 106B are formed on opposite sidewalls of the word gate 104 and are electrically insulated from the word gate 104.

Each of the first and second memory cells 108A and 108B is formed by stacking an oxide film (O), a nitride film (N), and an oxide film (O) between one of the first and second control gates 106A and 106B formed of polysilicon corresponding to the M (Metal) of MONOS and the P-type well 102. The first and second control gates 106A and 106B may be formed of a conductive material such as a silicide.

One memory cell 100 has the first and second MONOS memory cells 108A and 108B having split gates (first and second control gates 106A and 106B). One word gate 104 is shared by the first and second MONOS memory cells 108A and 108B.

The first and second MONOS memory cells 108A and 108B function as charge trap sites. Each of the first and second MONOS memory cells 108A and 108B is capable of trapping charges in an ONO film 109.

As shown in FIG. 1, the word gates 104 arranged at an interval in a row direction B are connected in common with one word line WL formed of a polycide or the like.

The control gates 106A and 106B shown in FIG. 1 extend in a column direction (column direction A perpendicular to the surface of FIG. 1) and are shared by the memory cells 100 arranged in the column direction. Therefore, the control gates 106A and 106B are also called control gate lines.

A sub control gate line SCG [i+1] formed of a metal layer higher than the word gate, the control gate, and the word line is connected with the control gate line 106B of the [i]th memory cell 100[i] and the control gate line 106A of the [i+1]th memory cell 100[i+1].

An [i+1]th impurity layer 110[i+1] shared by the MONOS memory cell 108B of the [i]th memory cell 100[i] and the MONOS memory cell 108A of the [i+1]th memory cell 100[i+1] is formed in the P-type well 102.

The impurity layers 110[i], [i+1], and [i+2] are n-type impurity layers formed in the P-type well, for example. The impurity layers 110[i], [i+1], and [i+2] function as sub bit lines which extend in the column direction (direction perpendicular to the surface of FIG. 1) and are shared by the memory cells 100 arranged in the column direction. Therefore, the impurity layers 110[i], [i+1], and [i+2] are also called sub bit lines SBL[i], [i+1], and [i+2].

Non-Volatile Semiconductor Memory Device

The entire configuration of the non-volatile semiconductor memory device formed by using the memory cells 100 is described below with reference to FIGS. 2A to 2E.

Figure 2A:
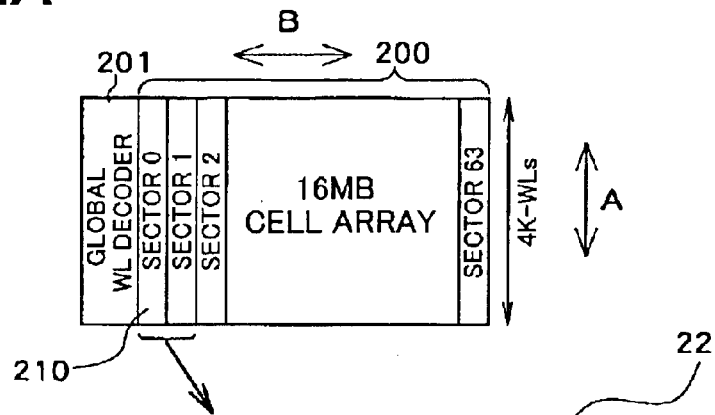
FIG. 2A is a plan view showing the layout of the entire non-volatile semiconductor memory device shown in FIG. 1.

FIG. 2A shows a planar layout of one chip of non-volatile semiconductor memory device. The non-volatile semiconductor memory device includes a regular cell array 200 and a global word line decoder 201. The regular cell array 200 has 0th to 63rd (64 in total) sector regions 210, for example. FIG. 2A shows an example in which the number of sectors N is 64.

As shown in FIG. 2A, the 64 sector regions 210 are formed by dividing the regular cell array 200 in the row direction B. Each of the sector regions 210 has a rectangular shape in which the column direction A is the longitudinal direction. The sector region 210 is a minimum unit of data erasure. Data stored in the sector region 210 is erased either collectively or by time division.

The regular cell array 200 has 4K word lines WL and 4K bit lines BL, for example. In the present embodiment, since the two MONOS memory cells 108A and 108B are connected with one bit line BL, the 4K bit lines BL mean a storage capacity of 8K bits. The storage capacity of each of the sector regions 210 is 1/64 of the storage capacity of the entire memory. Each of the sector regions 210 has a storage capacity defined as (4K word lines WL)×(64 bit lines BL)×2.

Figure 2B:
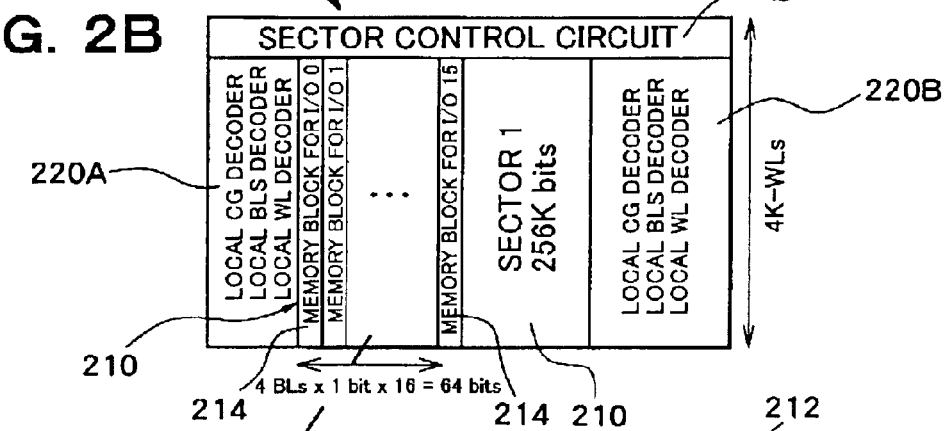
FIG. 2B is a plan view showing two sector regions shown in FIG. 2A.

FIG. 2B shows details of the two adjacent 0th and first sector regions 210 of the non-volatile semiconductor memory device shown in FIG. 2A. As shown in FIG. 2B, local driver regions (including a local control gate driver, local bit line select driver, and local word line driver) 220A and 220B are disposed on opposite sides of the two sector regions 210. A sector control circuit 222 is disposed on the upper side of the two sector regions 210 and the two local driver regions 220A and 220B, for example.

Each of the sector regions 210 has 17 first memory blocks 214 in total (example in which n=17) divided in the row direction B. The 16 first memory blocks 214 are regular memory blocks disposed corresponding to 16 (n−1=16) pieces of I/O0 to I/O15 so that 16 bits of data can be read out or written in at the same time. The remaining one first memory block 214 is a redundant memory block. When a defective cell is found in one of the 16 regular memory blocks 214, the redundant memory block 214 is used in place of the regular memory block 214 including the defective cell. The (n−1) bits may be set to one byte (8 bits), one double word (32 bits), or the like. As shown in FIG. 2B, each of the first memory blocks 214 has 4K (4096) word lines WL.

Figure 2C:
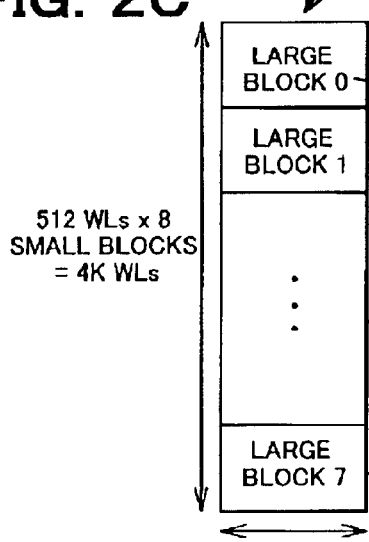
FIG. 2C is a plan view showing one memory block shown in FIG. 2B.
Figure 2D:
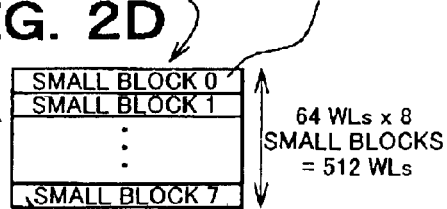
FIG. 2D is a plan view showing one large block shown in FIG. 2C.

As shown in FIG. 2C, each of the sector regions 210 shown in FIG. 2B is divided into eight (example in which M=8) large blocks 212 in the column direction A. As shown in FIG. 2D, each of the large blocks 212 is divided into eight (example in which m=8) small blocks 215 in the column direction A.

Figure 2E:
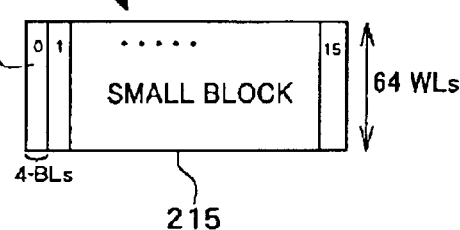
FIG. 2E is a plan view showing one small block shown in FIG. 2D.

As shown in FIG. 2E, each of the small blocks 215 has 64 word lines WL.

Sector Region

Figure 3:
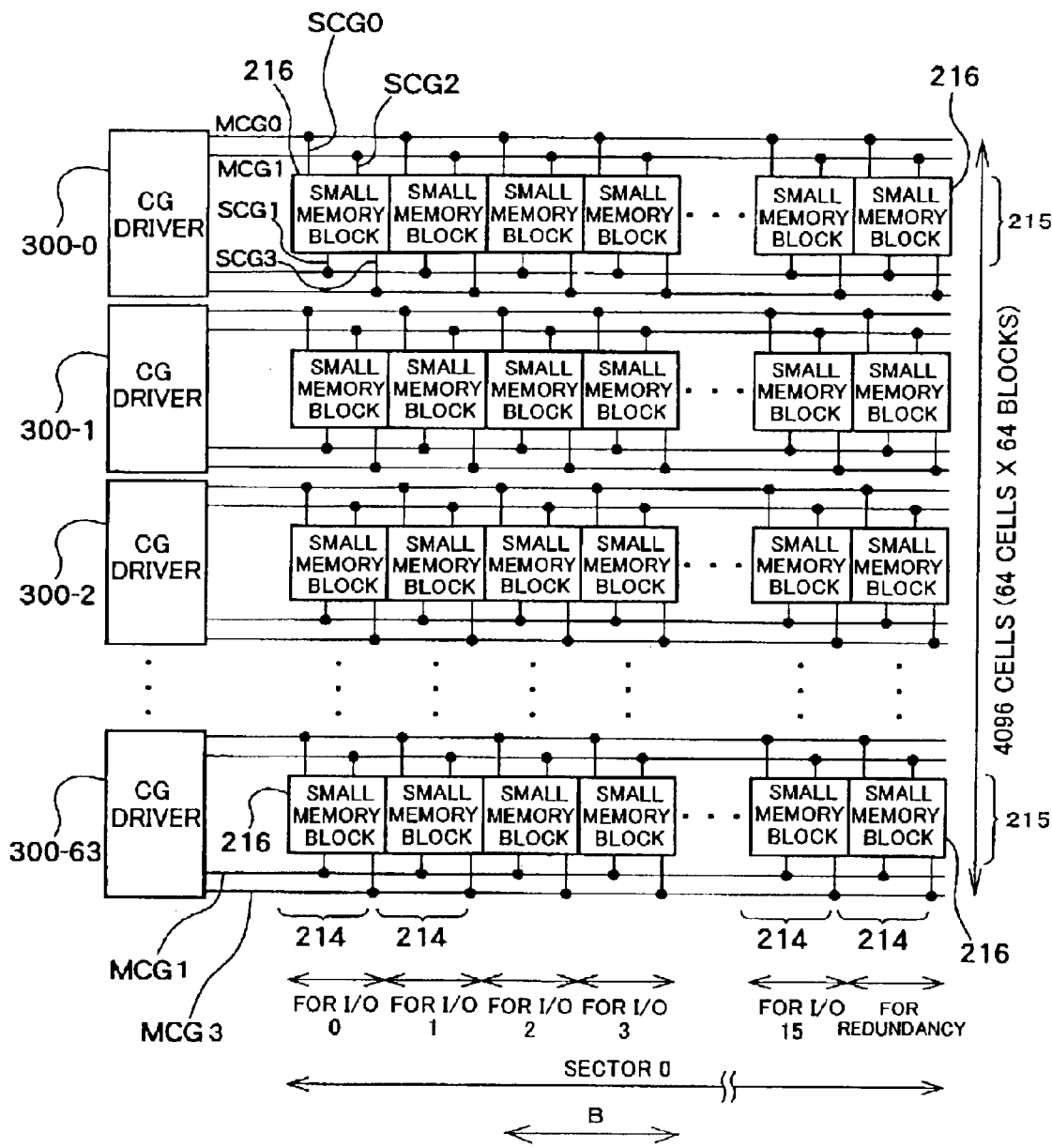
FIG. 3 is a diagram schematically showing the small memory blocks and interconnects in one sector region shown in FIG. 2B.
Figure 4:
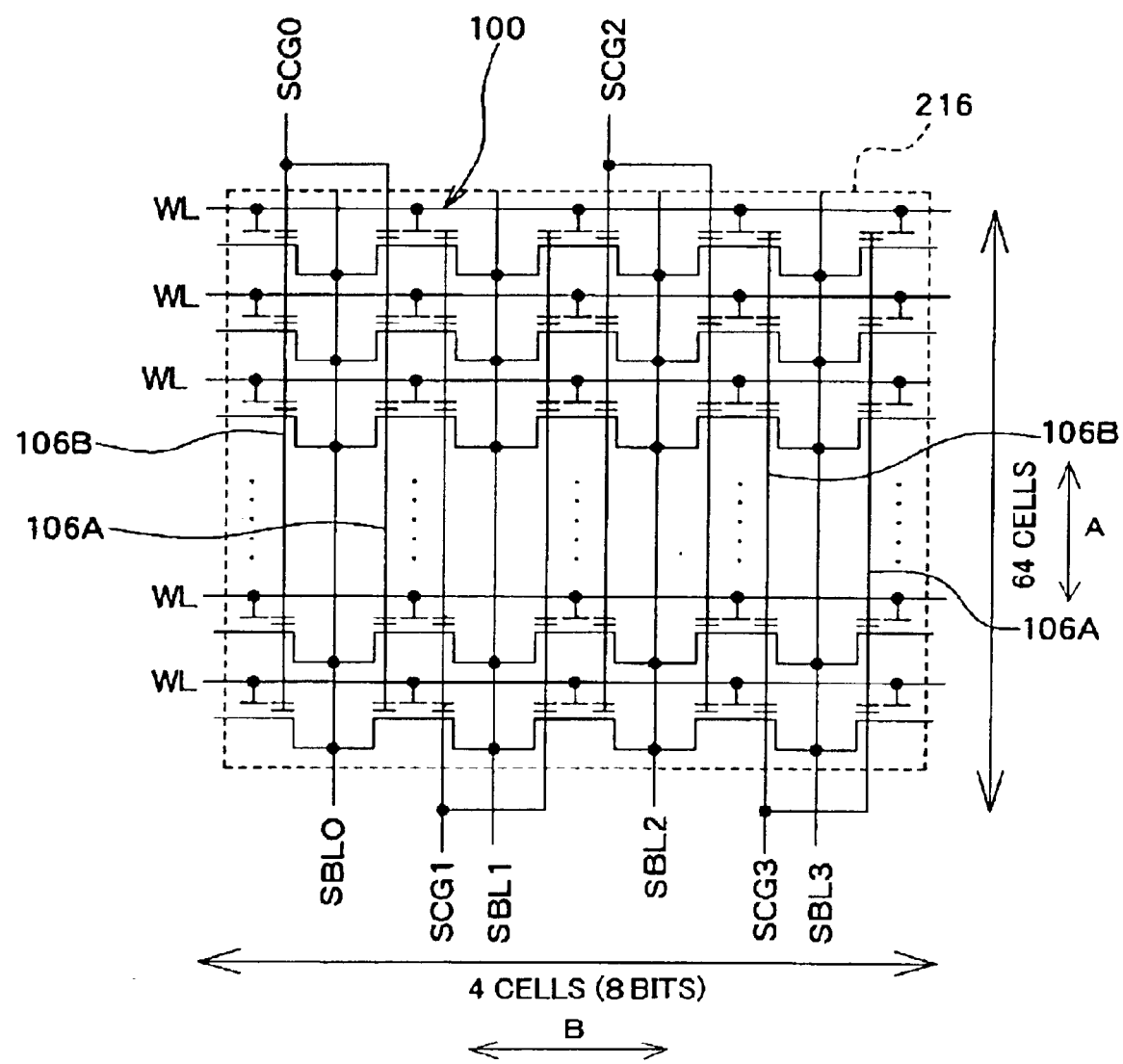
FIG. 4 is a diagram showing the configuration of the small memory block shown in FIG. 3.

FIG. 3 is a view showing details of the sector region 0 shown in FIG. 2A. Small memory blocks 216 shown in FIG. 3 are formed by dividing one small block 215 into seventeen (example in which n=17) pieces in the lateral (row) direction, as shown in FIG. 2E. In the small memory block 216 shown in FIG. 3, 64×4 memory cells 100 are arranged in the column direction and the row direction as shown in FIG. 4, for example. Four sub control gate lines SCG0 to SCG3, four sub bit lines SBL0 to SBL3 as data input/output lines, and 64 word lines WL are connected with one small memory block 216, for example.

The second control gates 106B of each of the memory cells in the even-numbered column (0th column or second column) and the first control gates 106A of each of the memory cells in the odd-numbered column (first column or third column) are connected in common with the even-numbered sub control gate lines SCG0 and SCG2. The second control gates 106B of each of the memory cells in the odd-numbered column (first column or third column) and the first control gates 106A of each of the memory cells in the even-numbered column (second column or fourth column) are connected in common with the odd-numbered sub control gate lines SCG1 and SCG3.

As shown in FIG. 3, 64 small memory blocks 216 are arranged in one first memory block 214 (regular memory block and redundant memory block) in the column direction. 16 small memory blocks 216 corresponding to 16 pieces of I/O0 to I/O15 and one redundant small memory block 216 are disposed in one first memory block 214 in the row direction (see also FIG. 2E). The small memory blocks 216 in one row make up the small block 215.

The 17 sub control gate lines SCG0 of the 17 small memory blocks 216 arranged in the row direction are connected in common with a main control gate line MCG0 in the row direction. Similarly, the 17 sub control gate lines SCG1 are connected in common with a main control gate line MCG1. The 17 sub control gate lines SCG2 are connected in common with a main control gate line MCG2. The 17 sub control gate lines SCG3 are connected in common with a main control gate line MCG3.

One of local control gate drivers (CG drivers) 300-0 to 300-63 (control gate driver section) are provided to each of the small blocks 215 in the sector region 0. The four main control gate lines MCG0 to MCG3 extending in the row direction are connected with each of the CG drivers 300-0 to 300-63.

Figure 5:
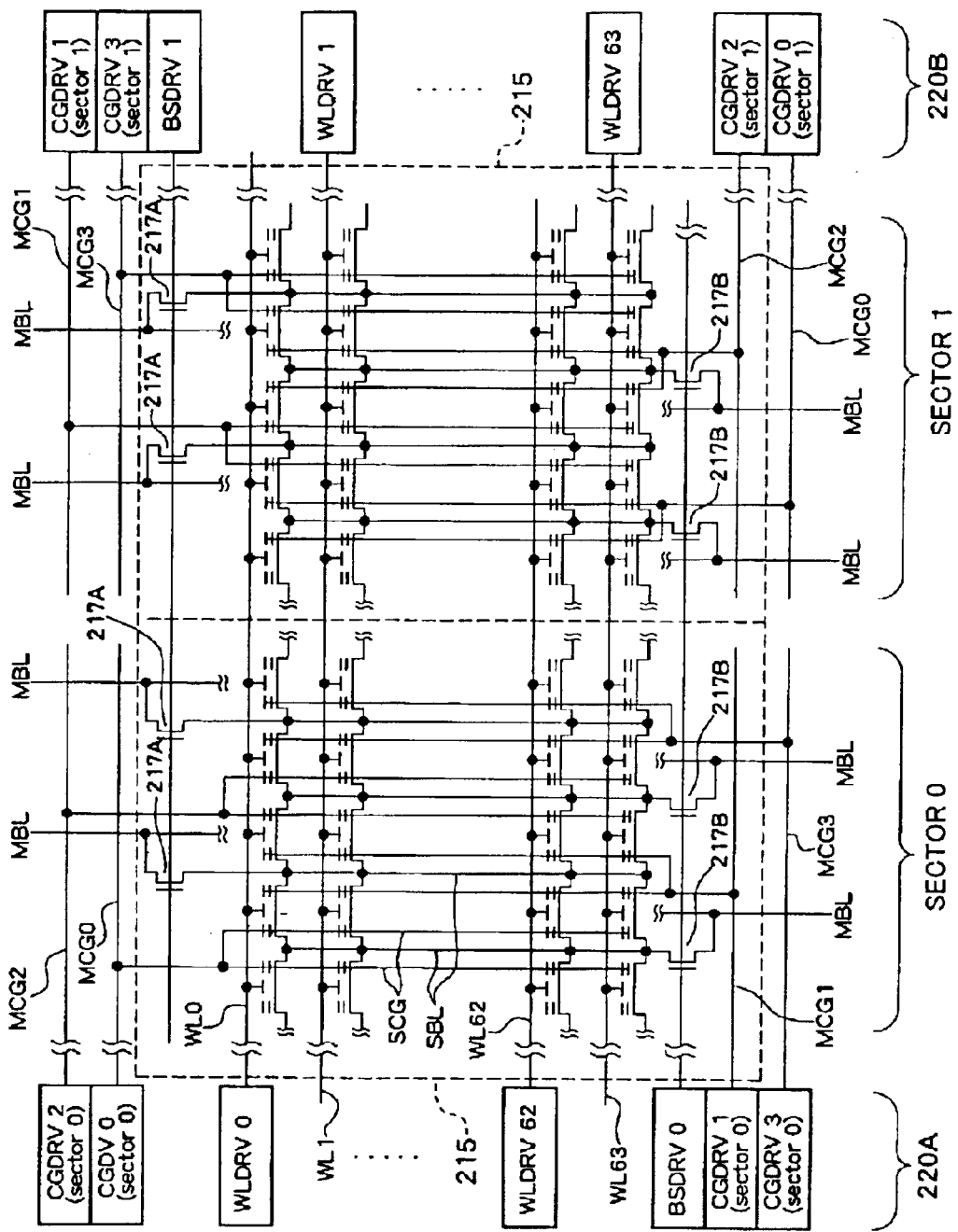
FIG. 5 is a diagram showing the relationship between the small blocks shown in FIG. 3 and local driver regions.

FIG. 5 shows the relationship between the two small blocks 215 which belong to each of the adjacent sector regions 0 and 1. The 64 word lines WL0 to WL63 are shared by the sector regions 0 and 1. The main control gate lines MCG0 to MCG3 and the main bit lines MBL are separately provided to the sector region 0 and the sector region 1. In FIG. 5, local control gate drivers CGDRV0 to CGDRV3 (one of the CG drivers 300-0 to 300-63 shown in FIG. 3) corresponding to the small block 215 in the sector region 0 and local control gate drivers CGDRV0 to CGDRV3 corresponding to the small block 215 in the sector region 1 are illustrated. The local control gate drivers are separately provided for each of the small blocks 215.

Each of the sub bit lines SBL0 (impurity layers) disposed for each of the small blocks 215 is connected in common with the main bit line MBL which is a metal interconnect. The main bit line MBL is shared by the small memory blocks 216 arranged in the column direction A. Bit line select gates (bit line select switches) 217A and 217B are disposed in the middle of each path from the main bit line MBL to each of the sub bit lines SBL0 in the small memory blocks 216. The bit line select gates 217A are connected with the odd-numbered sub bit lines SBL, and the bit line select gates 217B are connected with the even-numbered sub bit lines SBL, for example.

The small blocks 215 shown in FIG. 2D may be defined as follows. The memory cells 100 connected in the column direction in one small block 215 share the sub control gate line SCG (see FIG. 5) The memory cells 100 connected in the column direction in one small block 215 share the sub bit line SBL (see FIG. 5). The two small blocks 215 adjacent in the column direction are separated by the formation region of bit line select gates 217A and 217B. Data in the memory cells 100 connected in the row direction in one small block 215 can be erased at the same time since these memory cells 100 belong to one of the sectors.

Figure 6:
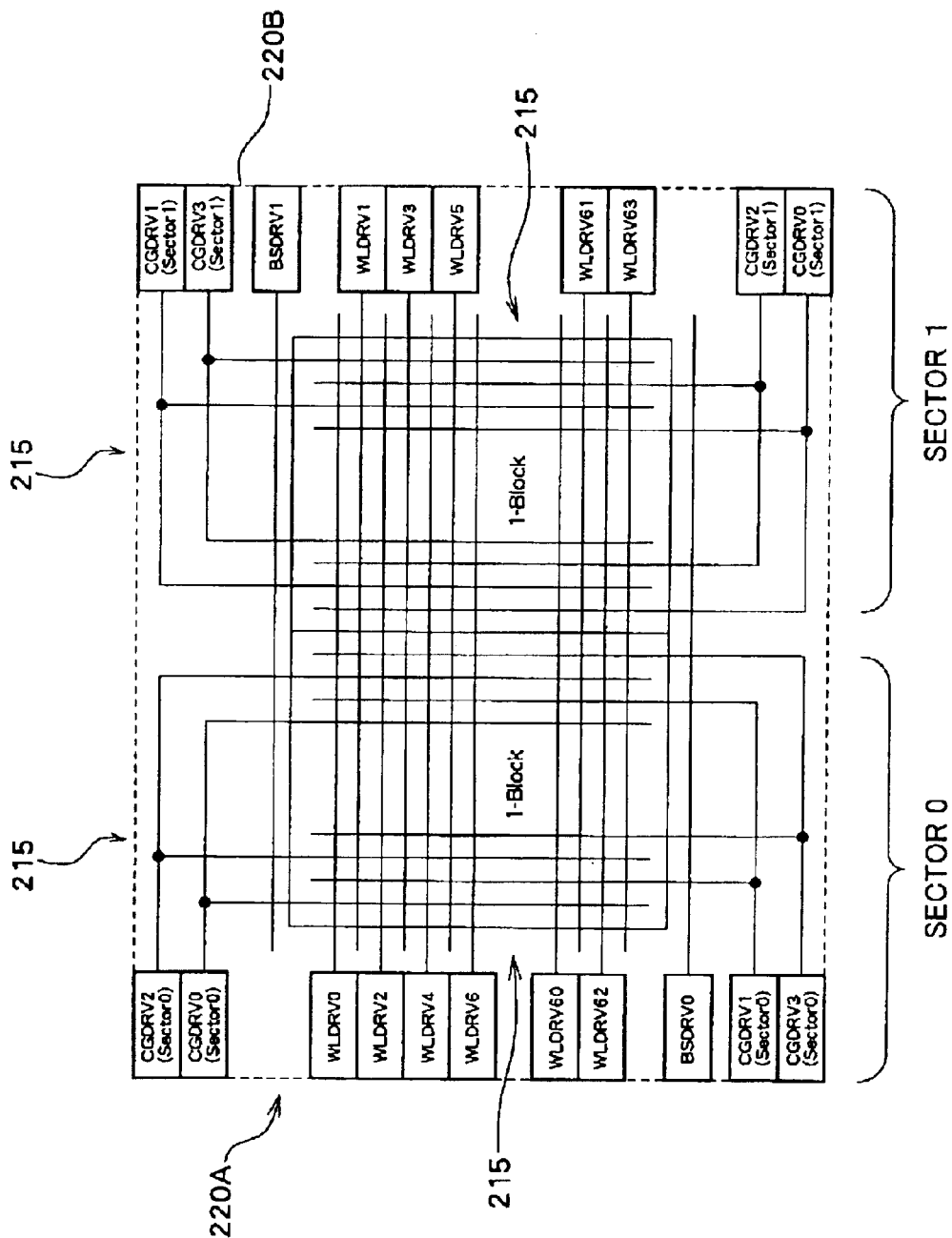
FIG. 6 is a diagram schematically showing the relationship between two small blocks and the local driver regions in two adjacent sectors.

FIG. 6 shows details of the two small blocks 215 in the adjacent 0th and first sector regions 210 and the local driver regions 220A and 220B on either side of the small blocks 215. As shown in FIG. 6, the local control gate line drivers CGDRV0 to CGDRV3 shown in FIG. 5 are disposed in the left local driver region 220A. The local control gate line drivers CGDRV0 to CGDRV3 shown in FIG. 5 are disposed in the right local driver region 220B.

Local word line drivers WLDRV0, ... WLDRV62 which drive the even-numbered word lines WL0, 2, ... 62 in the sectors 0 and 1 are disposed in the left local driver region 220A. Local word line drivers WLDRV1, ... WLDRV63 which drive the odd-numbered word lines WL1, 3, ... 63 in the sectors 0 and 1 are disposed in the right local driver region 220B.

As shown in FIGS. 5 and 6, a local bit line driver BSDRV1 which drives the bit line select gates 217A connected with the odd-numbered sub bit lines SBL in the sectors 0 and 1 is disposed in the right local driver region 220B, for example. A local bit line driver BSDRV0 which drives the bit line select gates 217B connected with the even-numbered sub bit lines SBL in the sectors 0 and 1 is disposed in the left local driver region 220A, for example.

Driver Circuits for Sectors 0 and 1

Circuits which drive the memory cells in the small blocks 215 in the sectors 0 and 1 are described below with reference to FIG. 7.

A predecoder 400, 64 global decoders 402-0 to 402-63, and a Y decoder 404 are provided as a configuration shared by the sectors 0 to 63.

The predecoder 400 decodes address signals A[20-0] which specify the non-volatile memory cell to be selected (selected cell). The meaning of the address signals A[20-0] is shown in Table 1.

TABLE 1

| Address  | Group       | Function       |                 |
|----------|-------------|----------------|-----------------|
| A [20:15]| Sector      | Choose 1 of 64 |                 |
| A [14:12]| Column      | Choose 1 of 8  |                 |
| A [11:9] | Large block | Choose 1 of 8  | Choose 1 of 4096|
| A [8:6]  | Small block | Choose 1 of 8  |                 |
| A [5:0]  | Row         | Choose 1 of 64 |                 |

As shown in Table 1, one of the 64 sectors is selected by the higher-order address signals A [20-15]. One bit of the four cells (eight bits) in one small memory block 216 shown in FIG. 4 is selected by the middle-order address signals A [14-12]. One of the 4096 word lines WL in one sector is selected by the lower-order address signals A [11-0]. One of the eight large blocks 212 in one sector is selected by the address signals A[11-9]. One of the eight small blocks 215 in one large block 212 is selected by the address signals A[8-6]. One of the 64 word lines WL in one small block 215 is selected by the address signals A[5-0].

The 64 global decoders 402-0 to 402-63 activate the 64 global word lines GWL[0] to GWL[63] based on results obtained by predecoding the lower-order address signals A[11-0] by the predecoder 400. Only one of the global word lines GWL is activated (Vdd) when reading or programming data. All the 64 global word lines GWL are activated (Vdd) when erasing data in one sector at one time. This causes all the word lines WL in one sector to be selected, and a word line voltage for erasure is supplied to the word lines WL.

The Y decoder 404 drives a Y-pass circuit 412 through a Y-pass select driver 410, thereby connecting the selected bit line in the small block 215 with a sense amplifier 520 (see FIG. 8) or a bit line driver in a subsequent stage.

Reference Cell Region

Figure 8:
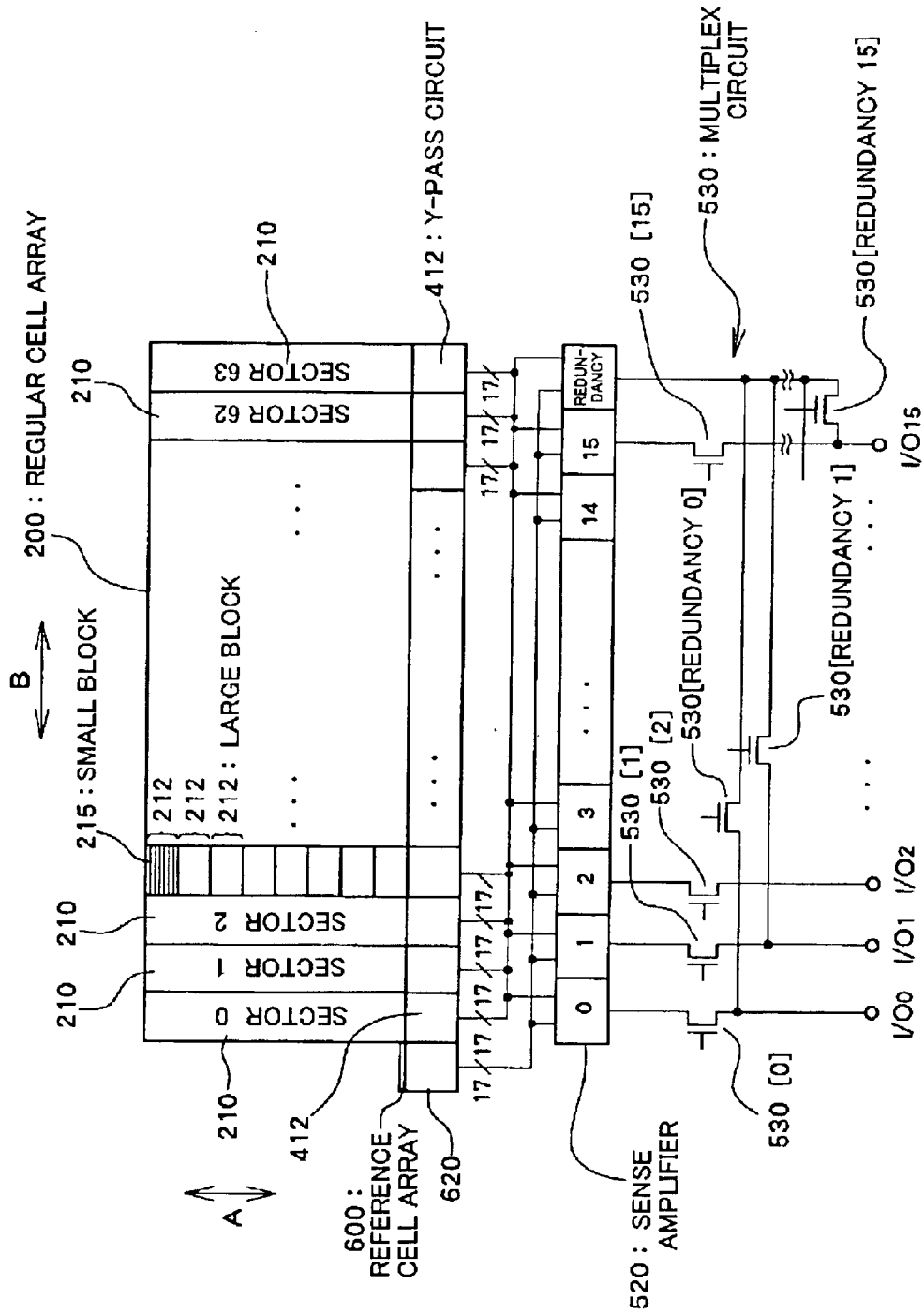
FIG. 8 is a diagram schematically showing the entire memory including a regular cell array, a reference cell array, Y-pass circuits, sense amplifiers, a multiplex circuit, and input/output terminals.

FIG. 8 shows the entire configuration of the memory including a reference cell region which is formed separately from the regular cell array 200 shown in FIGS. 2A to 2E.

It suffices that at least one memory cell 100 be provided in the reference cell region. In the present embodiment, a reference cell array 600 shown in FIG. 8 is disposed in the reference cell region.

The reference cell array 600 shown in FIG. 8 has the same number of memory cells 100 as the number of memory cells 100 (68) of one small block 215 in the regular cell array 200 in the row direction B. The number of memory cells 100 in the reference cell array 600 is smaller than the number of memory cells (64) of the small block 215 in the column direction A.

Figure 9:
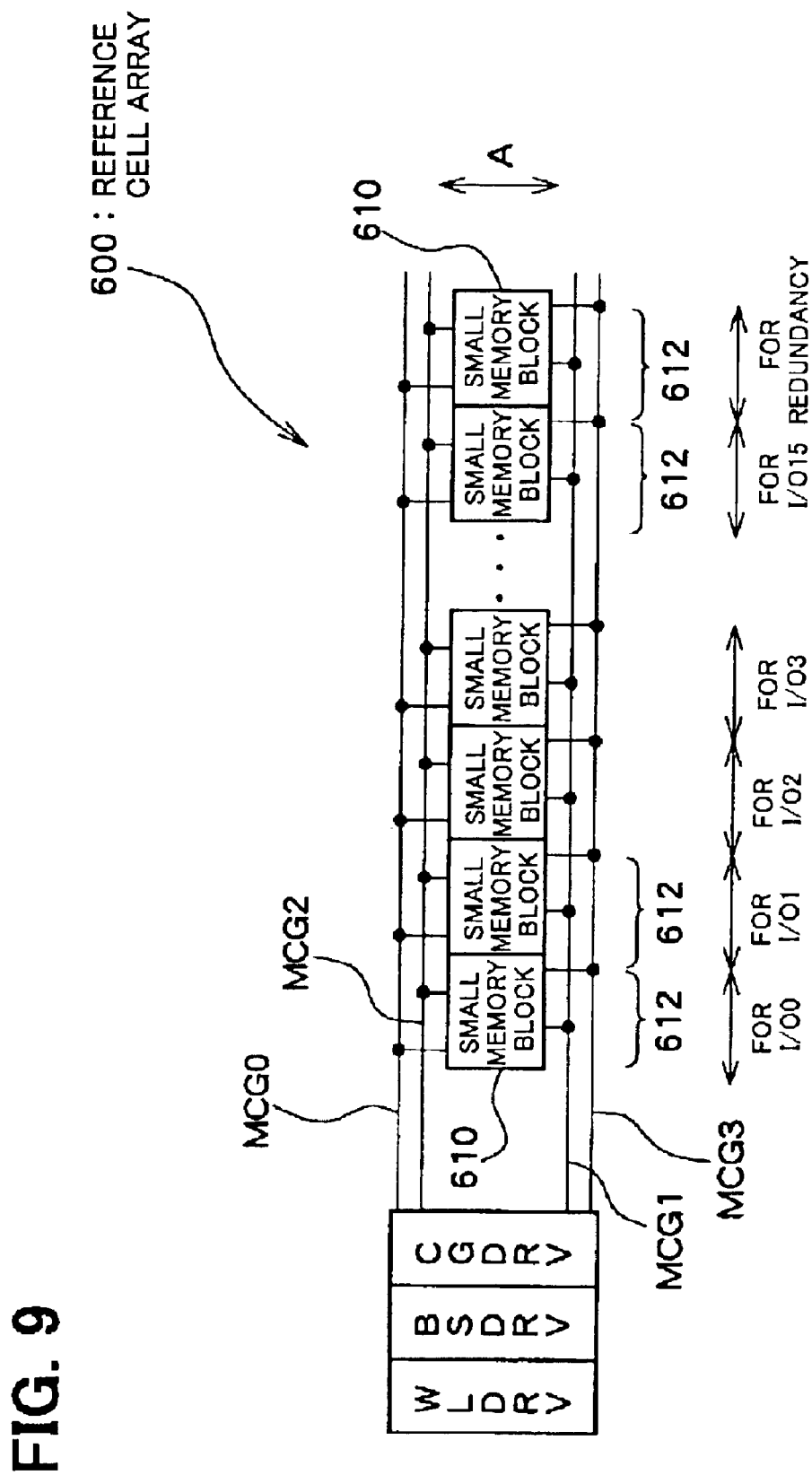
FIG. 9 is a diagram schematically showing the reference cell array shown in FIG. 8.

As shown in FIG. 9, 17 small memory blocks 610 are provided in the reference cell array 600 in the row direction B.

In the regular cell array 200, the 17 first memory blocks 214 divided in the row direction B contain the 64 small memory blocks 216 in the column direction A, as shown in FIG. 3. The reference cell array 600 has 17 second memory blocks 214 divided in the row direction B, as shown in FIG. 9. However, only one small memory block 610 is provided to the second memory block 612 in the column direction A.

Figure 12:
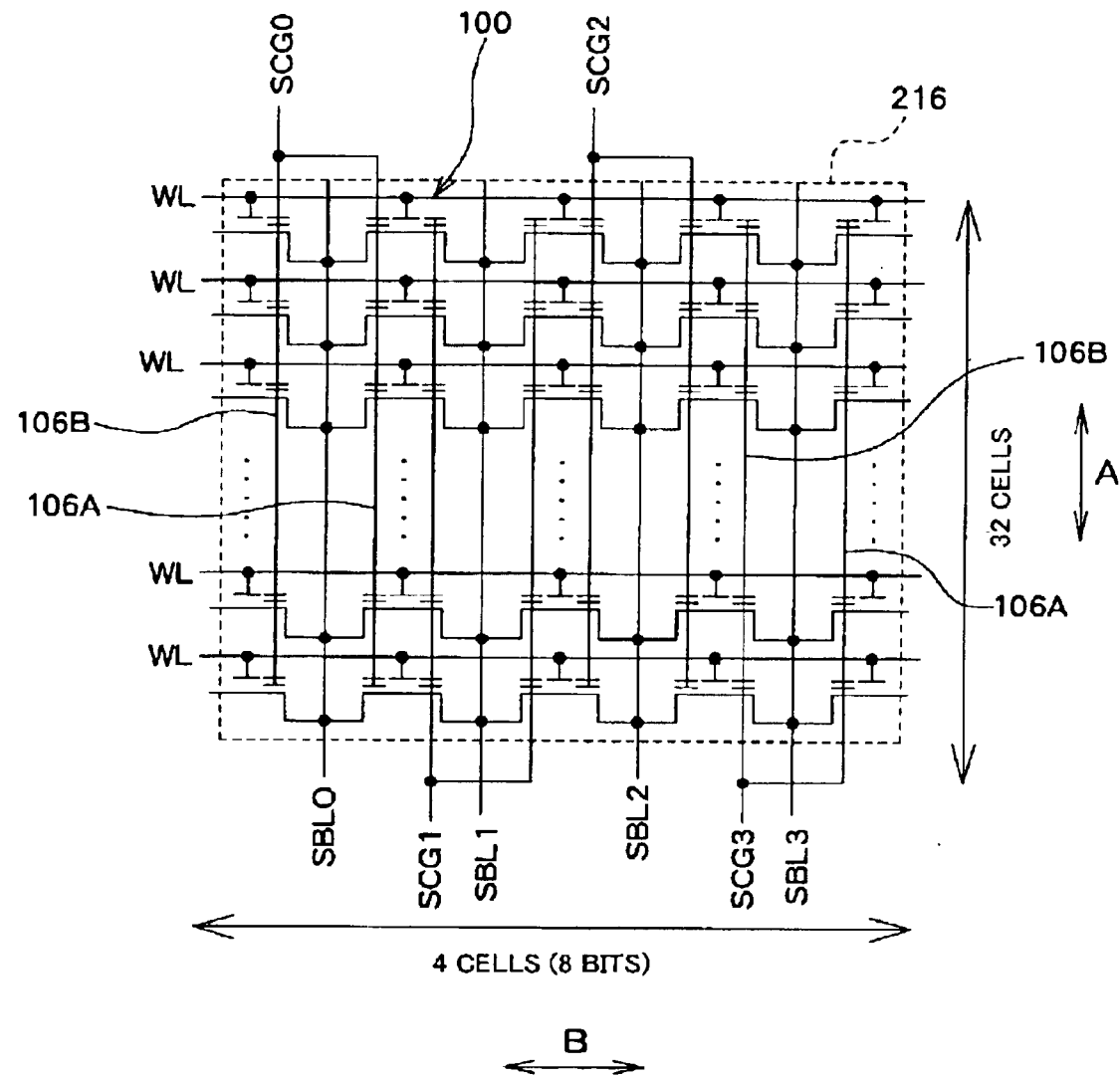
FIG. 12 is a diagram showing a small memory block in the reference cell array shown in FIG. 9.

The small memory blocks 215 disposed in each of the first memory blocks 214 in the regular cell array 200 have the 64 memory cells 100 in the column direction A, as shown in FIG. 4. The number of memory cells 100 of the small memory blocks 612 disposed in the reference cell array 600 in the column direction A is less than 64, for example 32, as shown in FIG. 12. Therefore, the reference cell array 600 has 64×32 memory cells 100 in the row direction and the column direction. The number of memory cells 100 in the reference cell array 600 is half of the number of memory cells 100 in the small block 215 (64×64) in the row direction and the column direction.

The reference cell array 600 includes the local control gate driver CGDRV, local bit line driver BSDRV, and local word line driver WLDRV in the same manner as the regular cell array 200.

The reason why the number of cells in the reference cell array 600 in the row direction is the same as the number of cells of the small block 215 is as follows.

A cell current of the cell 100 in the reference cell array 600 is used as a reference when detecting the cell current of the cell 100 in the regular cell array 200. Therefore, it is ideal that characteristics (temperature characteristics, voltage characteristics, and the like) of the cell currents coincide for the reference cell array 600 and the regular cell array 200. However, there may be a case where the characteristics of the cell current differ depending on the position of the cells. In order to decrease the difference depending on the position of the cells, the reference cell array 600 is formed while taking into consideration the arrangement of the cells in the small block 215. However, the number of cells in the column direction is decreased in order to decrease the number of reference memory cells.

All the memory cells 100 in the reference cell array 600 are set in an erased state before shipping from the factory.

Y-Pass Circuit and Sense Amplifier

Figure 7:
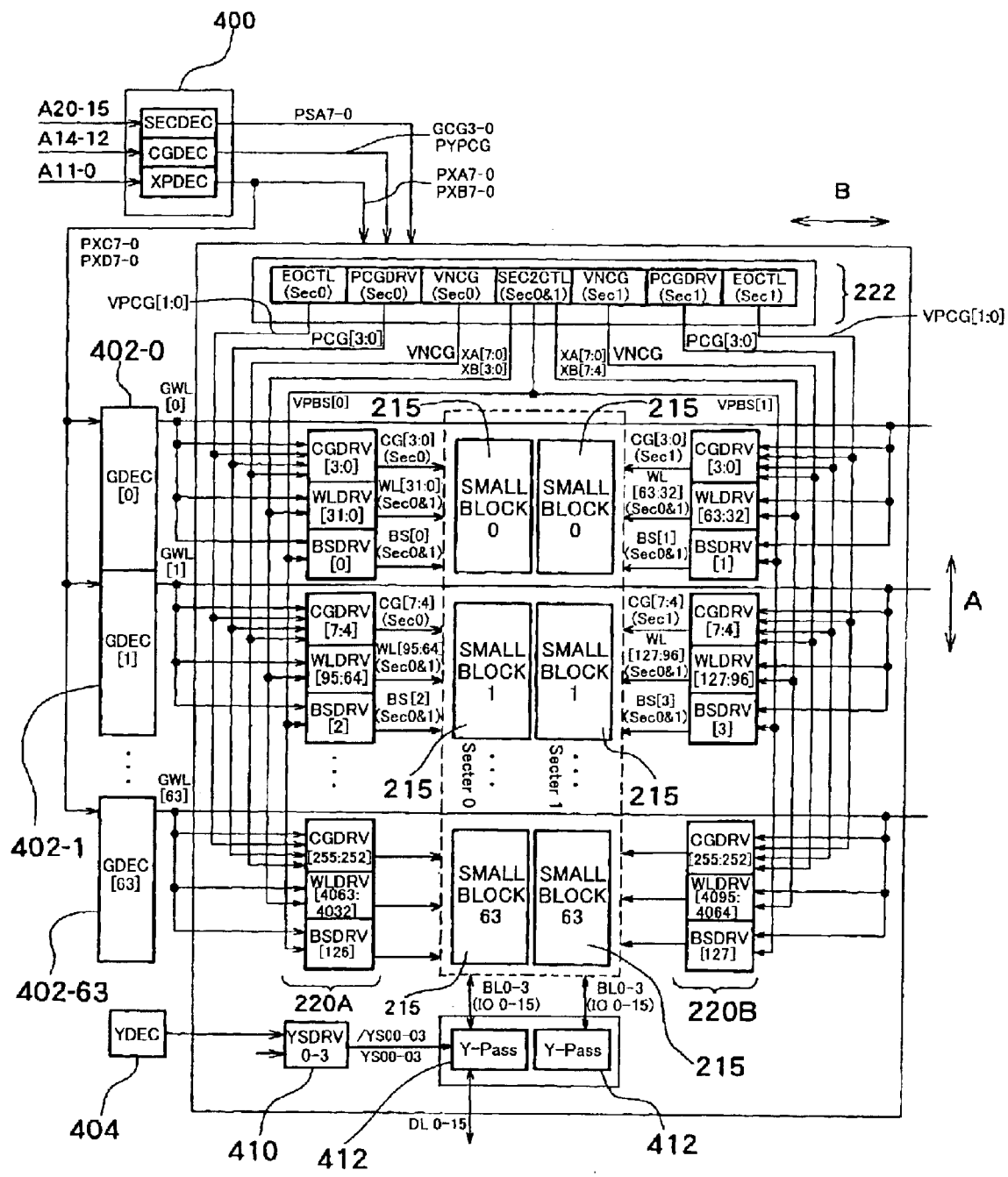
FIG. 7 is a block diagram showing peripheral driver circuits of two adjacent sectors.

As shown in FIG. 8, the Y-pass circuits 412 are connected with each of the 64 sectors 210 of the regular cell array 200 (see also FIG. 7). A Y-pass circuit 620 is connected with the reference cell array 600.

Figure 10:
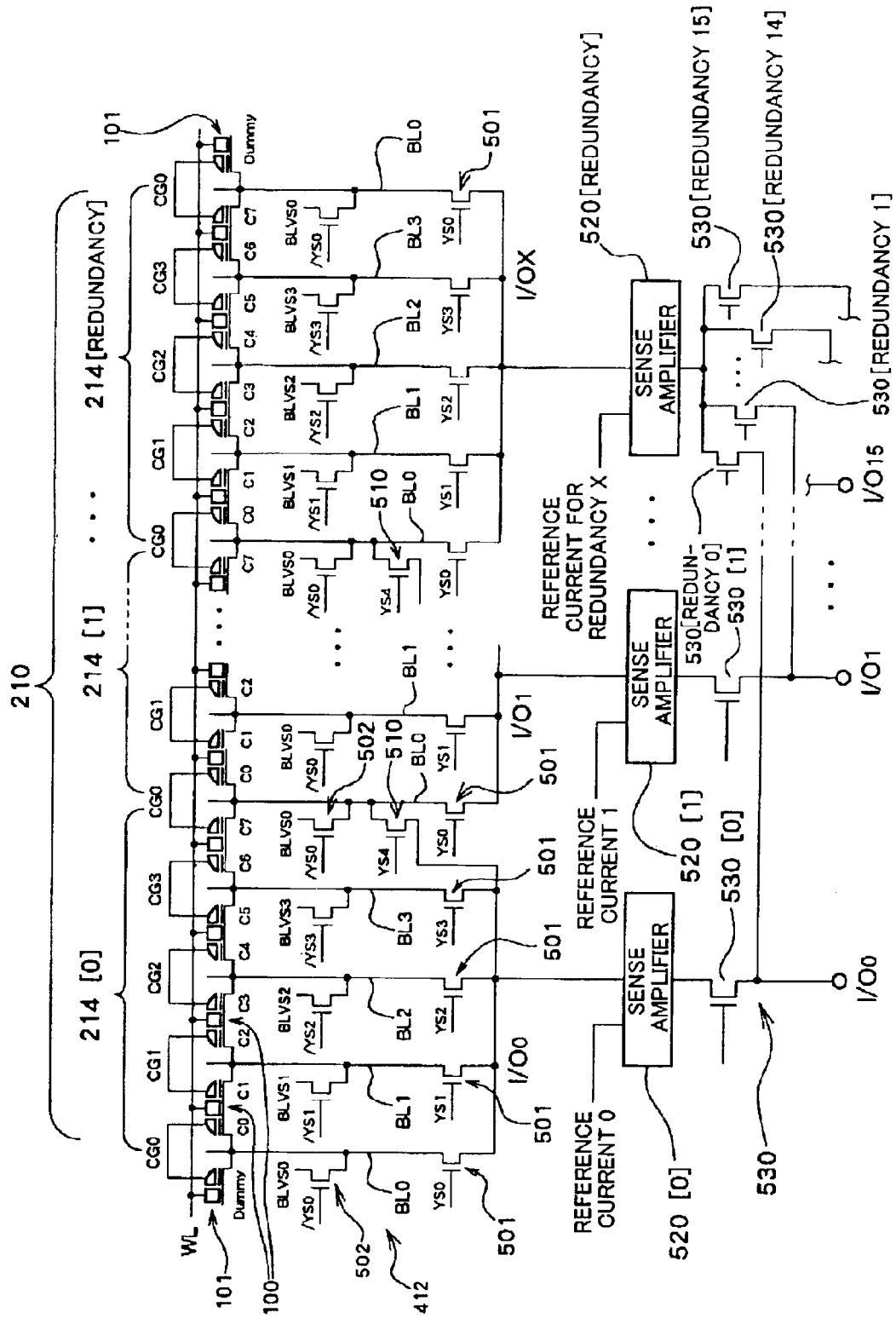
FIG. 10 is a circuit diagram showing an example of the Y-pass circuit connected with the regular cell array shown in FIG. 8.

FIG. 10 shows the Y-pass circuit 412 shown in FIGS. 7 and 8. One Y-pass circuit 412 is provided to each sector 210. Therefore, 64 (example in which M=64) Y-pass circuits 412 are provided in total. The 17 first memory blocks 214 divided corresponding to I/O0 to I/O15 and redundancy are disposed in one sector 210 (see also FIG. 2B).

boundary between the block region 214[0] and the block region 214[1] to be connected with or disconnected from the I/O output line (I/O0), for example. The second select gate 510 is also provided to the bit line BL0 connected with the right dummy cell 101 shown in FIG. 10. A gate voltage YS4 is supplied to the second select gate 510.

Voltages at each point when reading data in the case where one of the eight cells C0 to C7 in one first memory block 214 is selected as the selected cell are shown in Table 2.

TABLE 2

Read (regular cell array)

| Address | | | Se-lected Cell | Control Gate | | | | Y-Select Gate | | | | | Y-Deselect Gate | | | | BL | | | | BL VSS | | | |
|---|---|---|---|---|---|---|---|---|---|---|---|---|---|---|---|---|---|---|---|---|---|---|---|---|
| A14 | A13 | A12 | | CG0 | CG1 | CG2 | CG3 | YS0 | YS1 | YS2 | YS3 | YS4 | /YS0 | /YS1 | /YS2 | /YS3 | BL0 | BL1 | BL2 | BL3 | VS0 | VS1 | VS2 | VS3 |
| 0 | 0 | 0 | C0 | 1.5 V | 3.0 V | 0 V | 0 V | 0 V | Vdd | 0 V | 0 V | 0 V | Vdd | 0 V | Vdd | Vdd | 0 V | 0 V | Vdd | 0 V | | | | |
| 0 | 0 | 1 | C1 | 3.0 V | 1.5 V | 0 V | 0 V | Vdd | 0 V | 0 V | 0 V | 0 V | 0 V | Vdd | Vdd | Vdd | 0 V | 0 V | 0 V | Vdd | | | | |
| 0 | 1 | 0 | C2 | 0 V | 1.5 V | 3.0 V | 0 V | 0 V | 0 V | Vdd | 0 V | 0 V | Vdd | Vdd | 0 V | Vdd | 0 V | 0 V | 0 V | Vdd | | | | |
| 0 | 1 | 1 | C3 | 0 V | 3.0 V | 1.5 V | 0 V | 0 V | Vdd | 0 V | 0 V | 0 V | Vdd | 0 V | Vdd | Vdd | Vdd | 0 V | 0 V | 0 V | | | | |
| 1 | 0 | 0 | C4 | 0 V | 0 V | 1.5 V | 3.0 V | 0 V | 0 V | 0 V | Vdd | 0 V | Vdd | Vdd | Vdd | 0 V | Vdd | 0 V | 0 V | 0 V | | | | |
| 1 | 0 | 1 | C5 | 0 V | 0 V | 3.0 V | 1.5 V | 0 V | 0 V | Vdd | 0 V | 0 V | Vdd | Vdd | 0 V | Vdd | 0 V | Vdd | 0 V | 0 V | | | | |
| 1 | 1 | 0 | C6 | 3.0 V | 0 V | 0 V | 1.5 V | 0 V | 0 V | 0 V | 0 V | Vdd | 0 V | Vdd | Vdd | Vdd | 0 V | Vdd | 0 V | 0 V | | | | |
| 1 | 1 | 1 | C7 | 1.5 V | 0 V | 0 V | 3.0 V | 0 V | 0 V | 0 V | Vdd | 0 V | Vdd | Vdd | Vdd | 0 V | 0 V | 0 V | Vdd | 0 V | | | | |

The four memory cells 100 are connected in the row direction in each of the first memory blocks 214. The minimum number of memory cells 100 connected in the row direction in one first memory block 214 is four. The memory cell 100 can be specified based on the decoded output if the number of memory cells 100 is $2^N$ (N is an integer of two or more).

The eight cells (non-volatile memory cells) provided in the four memory cells 100 connected in the row direction in one first memory block 214 are defined as cells C0 to C7 as shown in FIG. 10.

Dummy cells 101 having one of the first and second control gates 108A and 108B and the word gate are disposed only on opposite ends of one sector region 210 in the row direction.

First select gates 501 are connected with each of the bit lines BL0 to BL3 provided in one first memory block 214. One of voltages YS0 to YS3 is applied to gates of the four first select gates 501 provided corresponding to one first memory block 214. The other end of each of the four first select gates 501 is connected in common with the I/O line. As shown in FIG. 8, I/O0 to I/O15 and I/Ox are respectively provided corresponding to the 17 first memory blocks 214[0] to 214[15] and 214[redundancy].

Transistors 502 of which the gate voltage is one of /YS0 to /YS3 are connected in the middle of the bit lines BL0 to BL3. When the transistor 502 is turned on, a voltage BLVS connected with a source of the transistor 502 is supplied to the bit line BL. The voltage BLVS is set at either Vdd or 0 V depending on the operation mode (see Tables 2 and 3).

A second select gate 510 provided to the Y-pass circuit 412 shown in FIG. 8 allows the bit line BL0 located at the In the case where each of the cells C2 of the first memory blocks 214[0] to 214[15] shown in FIG. 10 is selected, a select voltage (1.5V) is applied to the control gate CG1 of the selected cell C2, as shown in Table 2. An override voltage (3.0 V) is applied to the control gates CG2 of the non-selected opposite cells C3. A non-select voltage (0 V) is applied to the control gates CG0 and CG3 of other non-selected cells. As a result, a cell current from each of the selected cells C2 of the first memory blocks 214[0] to 214[15] respectively flows through the sense amplifiers 520[0] to 520[15] through the bit lines BL2 and the select gates 501 of which the gate signal YS2 is at the voltage Vdd.

In the case where a defective cell is present in one of the first memory blocks 214[0] to 214[15], the redundant memory block 214[redundancy] is selected in place of the first memory cell block 214 including the defective cell. Therefore, a cell current from the cell C2 of the redundant memory block 214[redundancy] flows through the sense amplifier 520[redundancy].

The 17 (example in which n=17) sense amplifiers 520[0] to 520[15] and 520[redundancy] are shared by the 64 sectors 210[0] to 210[63], as shown in FIG. 8.

A reference potential is supplied to the sense amplifiers 520[0] to 520[15] and 520[redundancy] from the Y-pass circuit 620 connected with the reference cell array 600.

Figure 11:
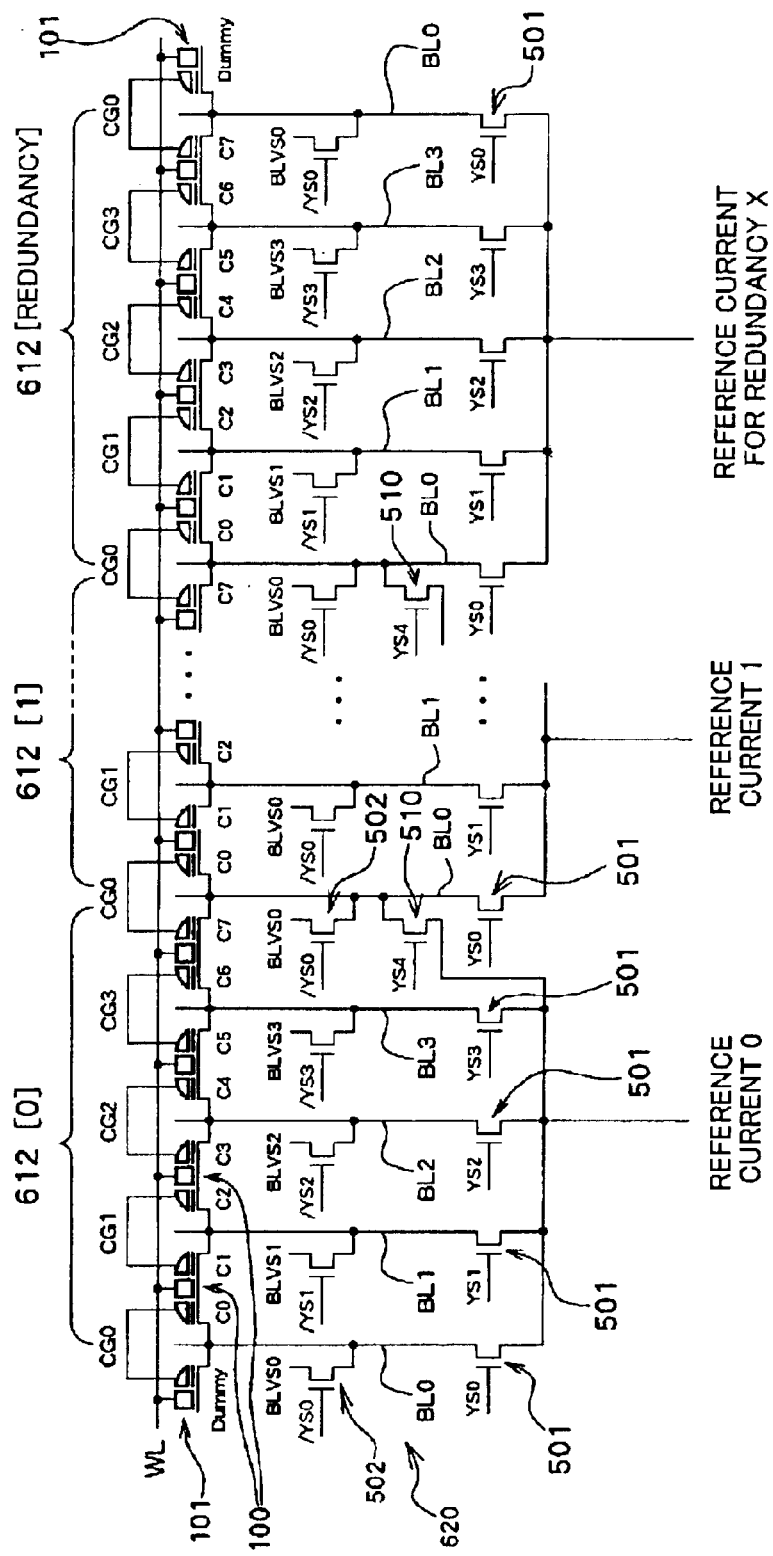
FIG. 11 is a circuit diagram showing another example of the Y-pass circuit connected with the reference cell array shown in FIG. 8.

FIG. 11 shows the Y-pass circuit 620. The Y-pass circuit 620 has the same configuration as the Y-pass circuit 412 shown in FIG. 10. Members shown in FIG. 11 which are the same as the members shown in FIG. 10 are indicated by the same symbols.

Voltages at each point when reading reference data in the case where one of the eight cells C0 to C7 in one second memory block 612 is selected as the selected cell are shown in Table 3.

TABLE 3

Read (reference cell array)

| Address | | | Se-lected Cell | Control Gate | | | | Y-Select Gate | | | | | Y-Deselect Gate | | | | BL | | | | BL VSS | | | |
|---|---|---|---|---|---|---|---|---|---|---|---|---|---|---|---|---|---|---|---|---|---|---|---|---|
| A14 | A13 | A12 | Cell | CG0 | CG1 | CG2 | CG3 | YS0 | YS1 | YS2 | YS3 | YS4 | /YS0 | /YS1 | /YS2 | /YS3 | BL VS0 | BL VS1 | BL VS2 | BL VS3 |
| 0 | 0 | 0 | C0 | 1.5 V | 1.5 V | 0 V | 0 V | 0 V | Vdd | 0 V | 0 V | 0 V | Vdd | 0 V | Vdd | Vdd | 0 V | 0 V | Vdd | 0 V |
| 0 | 0 | 1 | C1 | 1.5 V | 1.5 V | 0 V | 0 V | Vdd | 0 V | 0 V | 0 V | 0 V | 0 V | Vdd | Vdd | Vdd | 0 V | 0 V | 0 V | Vdd |
| 0 | 1 | 0 | C2 | 0 V | 1.5 V | 1.5 V | 0 V | 0 V | 0 V | Vdd | 0 V | 0 V | Vdd | Vdd | 0 V | Vdd | 0 V | 0 V | 0 V | Vdd |
| 0 | 1 | 1 | C3 | 0 V | 1.5 V | 1.5 V | 0 V | 0 V | Vdd | 0 V | 0 V | 0 V | Vdd | 0 V | Vdd | Vdd | Vdd | 0 V | 0 V | 0 V |
| 1 | 0 | 0 | C4 | 0 V | 0 V | 1.5 V | 1.5 V | 0 V | 0 V | 0 V | Vdd | 0 V | Vdd | Vdd | Vdd | 0 V | Vdd | 0 V | 0 V | 0 V |
| 1 | 0 | 1 | C5 | 0 V | 0 V | 1.5 V | 1.5 V | 0 V | 0 V | Vdd | 0 V | 0 V | Vdd | Vdd | 0 V | Vdd | 0 V | Vdd | 0 V | 0 V |
| 1 | 1 | 0 | C6 | 1.5 V | 0 V | 0 V | 1.5 V | 0 V | 0 V | 0 V | 0 V | Vdd | 0 V | Vdd | Vdd | Vdd | 0 V | Vdd | 0 V | 0 V |
| 1 | 1 | 1 | C7 | 1.5 V | 0 V | 0 V | 1.5 V | 0 V | 0 V | 0 V | Vdd | 0 V | Vdd | Vdd | Vdd | 0 V | 0 V | 0 V | Vdd | 0 V |

In Table 3, the control gate voltages of the selected cell and the non-selected opposite cell are set at 1.5 V which is the same as the select voltage, differing from Table 2. Specifically, 1.5V is applied to the non-selected opposite cell instead of the override voltage (3 V). This is because all the cells in the reference memory cell array 600 are programmed in an erased state before shipping from the factory. The override voltage is a voltage necessary for allowing a read current or a program current to flow by causing the transistor of the non-selected opposite cell to be turned on irrespective of the presence or absence of a program in the non-selected opposite cell. Therefore, since the cells are programmed in an erased state, a reference cell current can be read even if 1.5 V, which is the same as the select voltage, is applied to the control gate of the non-selected opposite cell.

The override voltage (3 V) may be applied to the non-selected opposite cell when reading reference data differing from Table 3.

When reading 16 (example in which n−1=16) bits of data from the regular cell array 200, 16 selected cells are specified by the address signals [20:0] shown in Table 1. When reading 16 bits of reference potential from the reference cell array 600 at the same time as the 16 bits of data, it suffices that the lower-order addresses A[14:12] among the column addresses A[20:12] and the lower-order addresses A[4:0] among the row addresses A[11:0] be used. This is because the row address (one of C0 to C7) of the reference cell array 600 can be specified by the addresses A[14:12] and the column address (one of 32 words lines) can be specified by the addresses A[4:0].

The addresses of the reference cell array 600 are specified in this manner while maintaining the positional correlation approximately the same as in the small block 215 in the regular cell array 200. Therefore, unevenness of cell current depending on the position of the cells can be reduced.

As shown in FIGS. 10 and 11, an element for switching from the defective memory block to the redundant memory block is not present on the input side of the sense amplifier 520. If such an element is added, the impedance of the current input path to the sense amplifier 520 is increased. This makes it necessary to change the access time.

As shown in FIG. 10, a multiplex circuit 530 is provided on the output side of the sense amplifiers 520[0] to 520[15] and 520[redundancy]. In the multiplex circuit 530, select gates 530[0] to 530[15] are respectively connected between the output ends of the sense amplifiers 520[0] to 520[15] and the 16 (example in which n−1=16) input/output terminals I/O0 to I/O15. Select gates 530[redundancy 0] to 530 [redundancy 15] are respectively connected between the output end of the sense amplifier 520[redundancy] and the input/output terminals I/O0 to I/O15.

If no defect is found in the first memory blocks 214[0] to 214[15], the select gates 530[0] to 530[15] are turned on when reading data, whereby data from each of the blocks 214[0] to 214[15] is output to the input/output terminals I/O0 to I/O15. At this time, all the select gates 530 [redundancy 0] to 530[redundancy 15] are turned off. If a defect is found in the first memory block 214[0], the select gate 530[0] is turned off and the select gate 530[redundancy 0] is turned on. This allows data to be read from the redundant memory block 214[redundancy] in place of the first memory block 214[0].

Note that the present invention is not limited to the above-described embodiment. Various modifications can be made within the scope of the invention.

The present invention is characterized by the setting of the reference cell array. Therefore, detailed description of voltage setting of the word line, bit line, and control gate line, and read operations, program operations, and erase operations of the non-volatile memory cells is omitted. If necessary, description of voltage setting and operations may be found in detail U.S. patent application Ser. No. 09/955, 160 applied for by the applicant of the present invention.

What is claimed is:

1. A non-volatile semiconductor memory device comprising:
    a regular cell array in which a plurality of memory cells are arranged in a column direction and a row direction, each of the memory cells having first and second non-volatile memory cells that are controlled by one word gate and first and second control gates, wherein:
    the regular cell array is divided in the row direction into N sector regions;
    each of the N sector regions is divided in the row direction into n first memory blocks; and
    one of the n first memory blocks is a redundant memory block including a plurality of redundant memory cells.

2. The non-volatile semiconductor memory device as defined in claim 1, further comprising:
    n sense amplifiers provided corresponding to the n first memory blocks; and
    a plurality of pass circuits each of which supplies a current which is output from one of the memory cells selected in each of the n first memory blocks to corresponding one of the n sense amplifiers.

3. The non-volatile semiconductor memory device as defined in claim 2, further comprising:

(n–1) data output terminals; and a multiplex circuit which selects (n–1) sense amplifier outputs from the n sense amplifiers, and then supplies the selected (n–1) sense amplifier outputs respectively to the (n–1) data output terminals.

4. The non-volatile semiconductor memory device as defined in claim 2, further comprising:

a reference cell region including at least one reference memory cell which supplies a reference current to the n sense amplifiers.

5. The non-volatile semiconductor memory device as defined in claim 4, wherein:

the reference cell region is divided in the row direction into n second memory blocks;

one of the n second memory blocks is a redundant memory block; and the reference current is respectively supplied from the n second memory blocks to the n sense amplifiers.

6. The non-volatile semiconductor memory device as defined in claim 5, wherein the number of the memory cells arranged in the row direction in the n first memory blocks is equal to the number of the memory cells arranged in the row direction in the n second memory blocks.

7. The non-volatile semiconductor memory device as defined in claim 6, wherein:

each of the N sector regions is divided in the column direction into M large blocks, each of the M large blocks being divided in the column direction into m small blocks; and the number of the memory cells arranged in the column direction in each of the n second memory blocks is smaller than the number of the memory cells arranged in the column direction in each of the m small blocks.

8. The non-volatile semiconductor memory device as defined in claim 6, wherein lower order addressed in row and column addresses used in the cell selection in the regular cell array is used in the cell selection in the reference cell region when data is read.

9. The non-volatile semiconductor memory device as defined in claim 1, wherein:

each of the n first memory blocks includes four bit lines extending in the column direction; and the number of the memory cells arranged in the row direction in each of the n first memory blocks is four.

10. The non-volatile semiconductor memory device as defined in claim 1, further comprising:

a control gate driver section which drives the first and second control gates of each of the memory cells in the regular cell array, wherein the control gate driver section includes N local control gate drivers provided corresponding to the N sector regions, each of the N local control gate drivers setting potentials of the first and second control gates in corresponding one of the sector regions independent of other sector regions.

11. The non-volatile semiconductor memory device as defined in claim 10, wherein when data is erased, one of the N local control gate drivers is selected to supply an erase potential to the first and second control gates in corresponding one of the N sector regions, data being erased in units of each of the sector regions.

12. The non-volatile semiconductor memory device as defined in claim 1, wherein each of the first and second non-volatile memory cells has an ONO film formed of an oxide film (O), a nitride film (N), and an oxide film (O) as a charge trap site.

* * * * *